US006462510B1

(12) United States Patent
Takada et al.

(10) Patent No.: US 6,462,510 B1
(45) Date of Patent: Oct. 8, 2002

(54) BATTERY VOLTAGE DETECTOR

(75) Inventors: Masahiro Takada, Hirakata (JP); Kazuhiko Tamesue, Fukuoka (JP); Yuji Torii, Toyohashi (JP)

(73) Assignees: Matsushita Electric Industrial Co., Ltd., Osaka (JP); Toyota Jidosha Kabushiki Kaisha, Aichi (JP)

( * ) Notice: Subject to any disclaimer, the term of this patent is extended or adjusted under 35 U.S.C. 154(b) by 0 days.

(21) Appl. No.: 09/786,342

(22) PCT Filed: Sep. 13, 1999

(86) PCT No.: PCT/JP99/04995

§ 371 (c)(1), (2), (4) Date: Mar. 9, 2001

(87) PCT Pub. No.: WO00/16108

PCT Pub. Date: Mar. 23, 2000

(30) Foreign Application Priority Data

Sep. 11, 1998 (JP) .......................................... 10-258295

(51) Int. Cl.[7] .................................................. H02J 7/00
(52) U.S. Cl. ...................................................... 320/116
(58) Field of Search ................................. 320/116, 139

(56) References Cited

U.S. PATENT DOCUMENTS

| | | | | | |
|---|---|---|---|---|---|
| 5,136,246 A | * | 8/1992 | Sakamoto | | 324/426 |
| 5,691,078 A | | 11/1997 | Kozaki et al. | | 324/428 |
| 5,705,914 A | | 1/1998 | Morita | | 340/636 |
| 5,929,593 A | * | 7/1999 | Eguchi | | 320/139 |
| 6,020,717 A | * | 2/2000 | Kadouchi et al. | | 320/116 |
| 6,278,280 B1 | * | 8/2001 | Horie et al. | | 324/436 |

FOREIGN PATENT DOCUMENTS

| | | |
|---|---|---|
| JP | 4-118671 | 10/1992 |
| JP | 7-17014 | 4/1995 |
| JP | 8-140204 | 5/1996 |
| JP | 9-15311 | 1/1997 |
| JP | 9-159701 | 6/1997 |
| JP | 9-171065 | 6/1997 |
| JP | 11160367 | 6/1999 |

OTHER PUBLICATIONS

English Language Abstract of JP–159701.
Partial English Language Translation of JP 7–17014.
English Language Abstract of JP 9–15311.
English Language Abstract of JP 8–140204.
English Language Abstract of JP 11–160367.
English Language Abstract of JP 9–171065.
Partial English Language Translation of JP 4–118671.

* cited by examiner

*Primary Examiner*—Edward H. Tso
*Assistant Examiner*—Pia Tibbits
(74) *Attorney, Agent, or Firm*—Greenblum & Bernstein, P.L.C.

(57) ABSTRACT

A battery power source device is composed of a plurality of battery modules, in which each battery module includes a number of serially connected cells. A voltage detection circuit is associated with each battery module. Each voltage detection circuit includes a differential amplifier that detects a voltage across end terminals of the associated battery module, and the detected voltage is digitized and output through a photo-coupler to a controller. The differential amplifier is connected to the battery module through photo-relays, which are closed in response to an open/close control signal only during a voltage detection operation, so that leak currents are eliminated. The differential amplifier and an associated A/D converter are provided with operating power obtained by transforming the voltage of the battery module with regulators, whereby noise effects are eliminated.

5 Claims, 7 Drawing Sheets

1a (1) high-voltage electric circuit system ← → vehicle-side electric circuit system
photo-relay
photo-relay
A/D
photo-coupler
photo-coupler
inverter
M
19a (19)
19n-1 (19)
19n (19)
1n-1 (1)
1n (1)
15
20
30
29
5
6
2
3
7
8

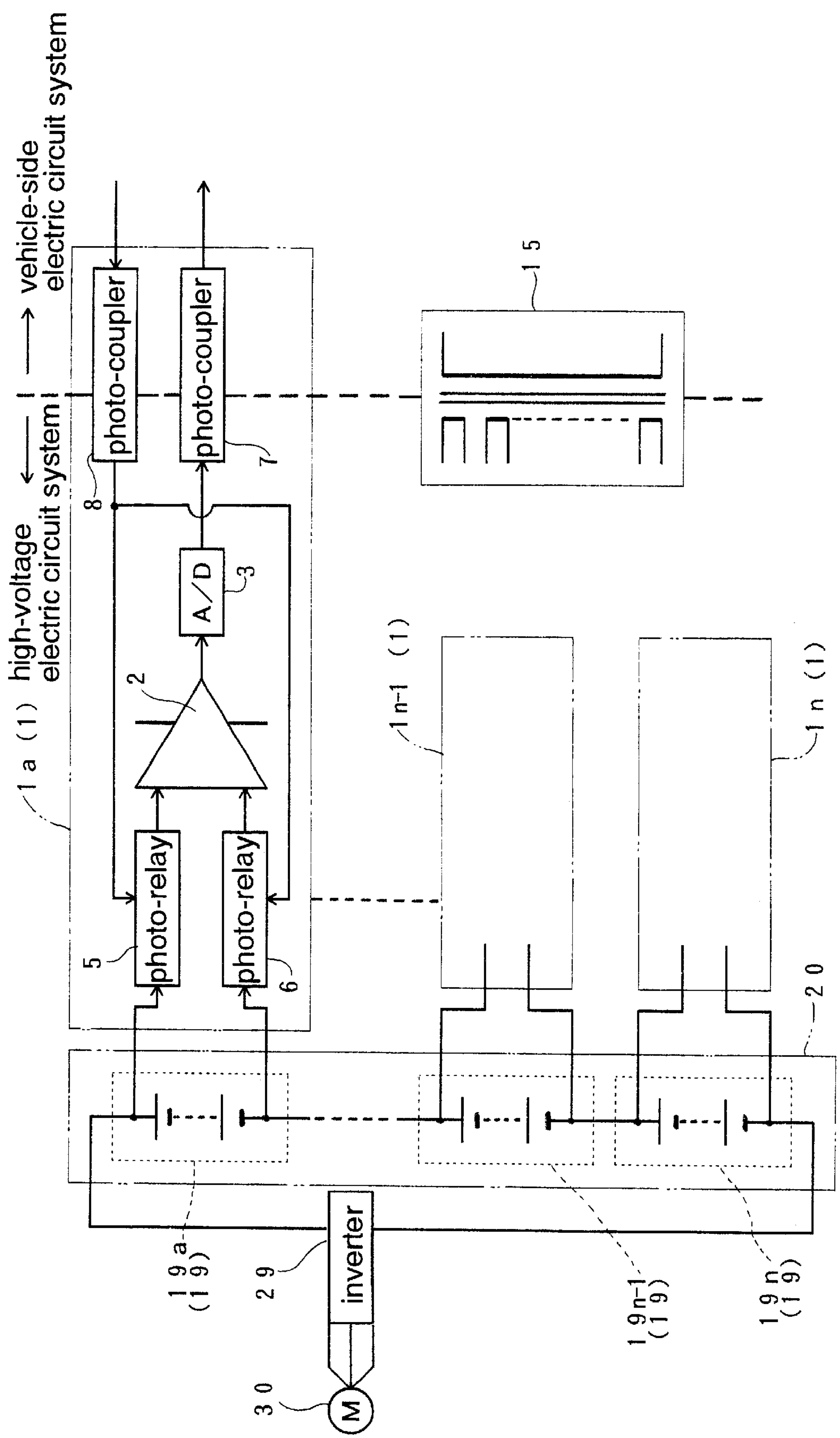
F i g . 1
1 a (1)
high-voltage electric circuit system
vehicle-side electric circuit system
photo-coupler
photo-coupler
8
7
A/D
3
2
photo-relay
photo-relay
5
6
1 5
1 n-1 (1)
1 n (1)
2 0
1 9 a (1 9)
2 9
inverter
3 0
M
1 9 n-1 (1 9)
1 9 n (1 9)

high-voltage electric circuit system
vehicle-side electric circuit system
photo-coupler
A/D
regulator
regulator
inverter
M
10a (10)
10n-1 (10)
10n (10)
19a (19)
19n-1 (19)
19n (19)
12
11
2
3
7
20
29
30 high-voltage electric circuit system
vehicle-side electric circuit system
13a (13)
12
11
regulator
regulator
photo-relay
photo-relay
5
6
2
3
A/D
8
7
photo-coupler
photo-coupler
13n-1 (13)
13n (13)
20
19a (19)
29
inverter
19n-1 (19)
19n (19)
30
M

BATTERY VOLTAGE DETECTOR

TECHNICAL FIELD

The present invention relates to a battery power source device having a desired output power and composed of a number of serially-connected rechargeable battery cells, and to a battery voltage detecting device for determining voltage of each block of serially-connected cells for monitoring the operating condition of the battery power source device.

BACKGROUND ART

It is known in the art to constitute a battery power source device by connecting a large number of cells in series to attain a larger output voltage, because discrete cells have only a small electromotive force of about 1V to 2V. All of the serially-connected cells constituting such battery power source device must be in a normal and uniform operating state, and hence it is necessary to monitor the operating state of each of the cells. Battery voltage is a significant factor for determining the operating state of the battery. Accurate detection of battery voltage enables determination of the operating state of the battery.

FIG. 7 shows the arrangement of a prior art battery voltage detecting device adapted for a battery power source device in a vehicle which uses an electric motor in combination with an internal combustion engine as a power source. Cells are divided into a plurality of blocks (hereinafter referred to as battery modules) respectively consisting of a plurality of serially connected cells, and voltages of respective battery modules are separately detected. A motor 30 is composed of a large number of serially connected nickel metal hydride rechargeable battery cells to output a drive power necessary for driving the vehicle. Accordingly, the electric circuit system for driving the motor 30 is a high-voltage electric circuit in comparison to the electric circuit system for driving the engine.

The electric circuit system for driving the engine is a conventional low-voltage electric circuit, and the ground potential thereof is insulated from that of the electric circuit system for driving the motor, so that the high-voltage electric circuit is floating.

As shown in FIG. 7, cells are serially connected in units of a predetermined number (twelve) to make up separate battery modules 19, and the battery power source device outputs a voltage obtained by all of the serially connected battery modules 19*a* to 19*n* for driving the motor 30 through an inverter 29. In order to detect the various voltages of the battery modules 19*a* to 19*n*, voltage detection circuits 40*a* to 40*n* are provided for the battery modules 19*a* to 19*n*, respectively. Each voltage detection circuit 40 includes a differential amplifier 2 for detecting the electric potential across the end terminals of the battery module 19, and the detected voltage of the battery module is digitized with an A/D converter 3. The voltage relating data thus obtained is then output to the vehicle-side electric circuit system for driving the engine, which has a different ground potential than that of the high-voltage electric circuit system and is electrically insulated therefrom, through a photo-coupler 7. The operating power for the voltage detection circuits 40*a* to 40*n* has to be supplied independently because the potential of these circuits measured from ground is different. Therefore, a power source 15 supplies operating power separately through a transformer having separate windings for each of the voltage detection circuits 40*a* to 40*n*.

The above-described prior art battery voltage detecting device had the following problems:

(1) Since the voltage detection circuits 40 are always connected to the battery modules 19, leak currents flow from the battery modules 19 also when voltage is not being detected, and the batteries are discharged even when the battery power source device is not in use.

(2) Since the voltage detection circuits 40*a* to 40*n* operate at separate ground potentials, a power source 15 for supplying operating power separately is required. However, the power supplied from the power source 15 tends to be affected by common mode noise, resulting in errors in the voltage detection due to the influence of noise.

It is an object of the present invention to provide a battery voltage detecting device, in which there are no leak currents from battery modules. It is another object of the invention to provide a battery voltage detecting device without a power source that is susceptible to the effect of noise.

DISCLOSURE OF THE INVENTION

To achieve the above-mentioned objects, the present invention provides a battery voltage detecting device provided in a battery power source device used as a drive power source of an electric motor for a vehicle, wherein a plurality of rechargeable battery cells are serially connected to constitute a battery pack. The cells are divided into a plurality of groups each including a predetermined number of serially connected cells to form a plurality of battery modules. The battery pack is mounted on the vehicle with its ground potential being electrically insulated from ground potential of an electric circuit system of a controller for the vehicle. The battery voltage detecting device according to one aspect of the invention includes: a plurality of voltage detection circuits, respectively provided to the plurality of battery modules, each of the plurality of voltage detection circuits including a differential detecting means for detecting voltage across end terminals of a battery module, open/close means which open and close for connecting and disconnecting the differential detecting means to and from the end terminals of the battery module, an A/D converter for digitizing detected voltage of the battery module output from the differential detecting means, an output data transmission means for transmitting data output from the A/D converter to the electric circuit system of the controller for the vehicle in electrical insulation therefrom, and an open/close signal transmission means for transmitting an open/close signal output from the electric circuit system of the controller for the vehicle to the open/close means in electrical insulation therefrom; and an operating power source electrically insulated from the ground potential of the electric circuit system of the controller for the vehicle for providing each of the voltage detection circuits separately with operating power.

According to this arrangement, an open/close means is provided between the differential detecting means and the end terminals of a battery module, and the open/close means operates upon input of an open/close control signal from an open/close signal transmission means to connect the differential detecting means to the end terminals of the battery module only during the detection of voltage thereof. Accordingly, the differential detecting means is disconnected from the end terminals of the battery module except when voltage is detected, whereby wasteful discharge of the battery module due to leak currents is eliminated.

The battery voltage detecting device according to another aspect of the invention includes a plurality of voltage detection circuits, each provided to a unit of a plurality of battery modules, each of the plurality of voltage detection circuits including a differential detecting means connected through a detection switching circuit to the unit of the plurality of battery modules for detecting voltage across end terminals of a selected one of the plurality of battery modules, an A/D converter for digitizing detected voltage of the battery module output from the differential detecting means, an output data transmission means for transmitting data output from the A/D converter to the electric circuit system of the controller for the vehicle in electrical insulation therefrom, an open/close signal transmission means for transmitting an open/close signal output from the electric circuit system of the controller for the vehicle to the detection switching circuit in electrical insulation therefrom; and an operating power source electrically insulated from the ground potential of the electric circuit system of the controller for the vehicle for providing each of the voltage detection circuits separately with operating power. The detection switching circuit includes a plurality of open/close means which open and close for respectively connecting and disconnecting the differential detecting means to and from the respective end terminals of the plurality of battery modules, and open/close control means for separately open and close a selected one of the plurality of open/close means in accordance with the open/close control signal input from the open/close signal transmission means, whereby the selected one of open/close means is closed to connect the differential detecting means to the end terminals of the selected one of the battery modules.

According to this arrangement, a common voltage detection circuit, including a differential detecting means, an A/D converter, and an output data transmission means, is provided to a unit of a plurality of battery modules. A detection switching means having open/close means switchably connects the differential detecting means to the end terminals of a selected one of the battery modules in accordance with a signal from the open/close signal transmission means. The number of the voltage detection circuits is thus reduced. Also, since the differential detecting means is disconnected from the end terminals of the battery module except when voltage is detected, whereby wasteful discharge of the battery module due to leak currents is eliminated.

The battery voltage detecting device according to a further aspect of the invention includes a plurality of voltage detection circuits, respectively provided to the plurality of battery modules, each of the plurality of voltage detection circuits including a differential detecting means for detecting voltage across end terminals of a battery module, a first voltage conversion means for supplying the differential detecting means with operating power by transforming the voltage of the battery module, an A/D converter for digitizing detected voltage of the battery module output from the differential detecting means, a second voltage conversion means for supplying the A/D converter with operating power by transforming the voltage of the battery module, an output data transmission means for transmitting data output from the A/D converter to the electric circuit system of the controller for the vehicle in electrical insulation therefrom.

According to this arrangement, the differential detecting means and the A/D converter are provided with operating power with the first and second voltage conversion means which transform the voltage of the battery module, and hence an additional power source for supplying operating power to the differential detecting means and the A/D converter is not required. Thereby, the voltage detection circuit is prevented from being affected by common mode noise resulting from such additional power source which may cause erroneous voltage detection.

The battery voltage detecting device according to another aspect of the invention includes: a plurality of voltage detection circuits, respectively provided to the plurality of battery modules, each of the plurality of voltage detection circuits including a differential detecting means for detecting voltage across end terminals of a battery module, open/close means which open and close for connecting and disconnecting the differential detecting means to and from the end terminals of the battery module, a first voltage conversion means for supplying the differential detecting means with operating power by transforming the voltage of the battery module, an A/D converter for digitizing detected voltage of the battery module output from the differential detecting means, a second voltage conversion means for supplying the A/D converter with operating power by transforming the voltage of the battery module, an output data transmission means for transmitting data output from the A/D converter to the electric circuit system of the controller for the vehicle in electrical insulation therefrom, and an open/close signal transmission means for transmitting an open/close signal output from the electric circuit system of the controller for the vehicle to the open/close means in electrical insulation therefrom.

According to this arrangement, an open/close means is provided between the differential detecting means and the end terminals of a battery module, and the open/close means operates upon input of an open/close control signal from an open/close signal transmission means to connect the differential detecting means and the end terminals of the battery module only during the detection of voltage thereof. Accordingly, the differential detecting means is disconnected from the end terminals of the battery module except when voltage is detected, whereby wasteful discharge of the battery module due to leak currents is eliminated. Also, the differential detecting means and the A/D converter are provided with operating power with the first and second voltage conversion means which transform the voltage of the battery module, and hence an additional power source for supplying operating power to the differential detecting means and the A/D converter is not required. Thereby, the voltage detection circuit is prevented from being affected by common mode noise resulting from such additional power source which may cause erroneous voltage detection.

The battery voltage detecting device according to yet another aspect of the invention includes: a plurality of voltage detection circuits, each provided to a unit of a plurality of battery modules, each of the plurality of voltage detection circuits including a differential detecting means connected through a detection switching circuit to the unit of the plurality of battery modules for detecting voltage across end terminals of a selected one of the plurality of battery modules, a first voltage conversion means for supplying the differential detecting means with operating power by transforming the voltage of the battery module, an A/D converter for digitizing detected voltage of the battery module output from the differential detecting means, a second voltage conversion means for supplying the A/D converter with operating power by transforming the voltage of the battery module, an output data transmission means for transmitting data output from the A/D converter to the electric circuit system of the controller for the vehicle in electrical insulation therefrom, an open/close signal transmission means for transmitting an open/close signal output from the electric circuit system of the controller for the vehicle to the detection switching circuit in electrical insulation therefrom, wherein the detection switching circuit includes a plurality of open/close means which open and close for respectively connecting and disconnecting the differential detecting means to and from the respective end terminals of the plurality of battery modules, and open/close control means for separately open and close a selected one of the plurality of open/close means in accordance with the open/close control signal input from the open/close signal transmission means, whereby the selected one of open/close means is closed to connect the differential amplifier to the end terminals of the selected one of the battery modules.

According to this arrangement, a common voltage detection circuit, including a differential detecting means, an A/D converter, and an output data transmission means, is provided to a unit of a plurality of battery modules. A detection switching means having open/close means switchably connects the differential detecting means to the end terminals of a selected one of the battery modules in accordance with a signal from the open/close signal transmission means. The number of the voltage detection circuits is thus reduced. Also, since the differential detecting means is disconnected from the end terminals of the battery module except when voltage is detected, whereby wasteful discharge of the battery module due to leak currents is eliminated. Also, the differential detecting means and the A/D converter are provided with operating power with the first and second voltage conversion means which transform the voltage of the battery module, and hence an additional power source for supplying operating power to the differential detecting means and the A/D converter is not required. Thereby, the voltage detection circuit is prevented from being affected by common mode noise resulting from such additional power source which may cause erroneous voltage detection.

BRIEF DESCRIPTION OF THE DRAWINGS

FIG. 1 is a circuit diagram showing the configuration of a battery voltage detecting device according to one embodiment of the present invention;

BEST MODE FOR CARRYING OUT THE INVENTION

Figure 2:
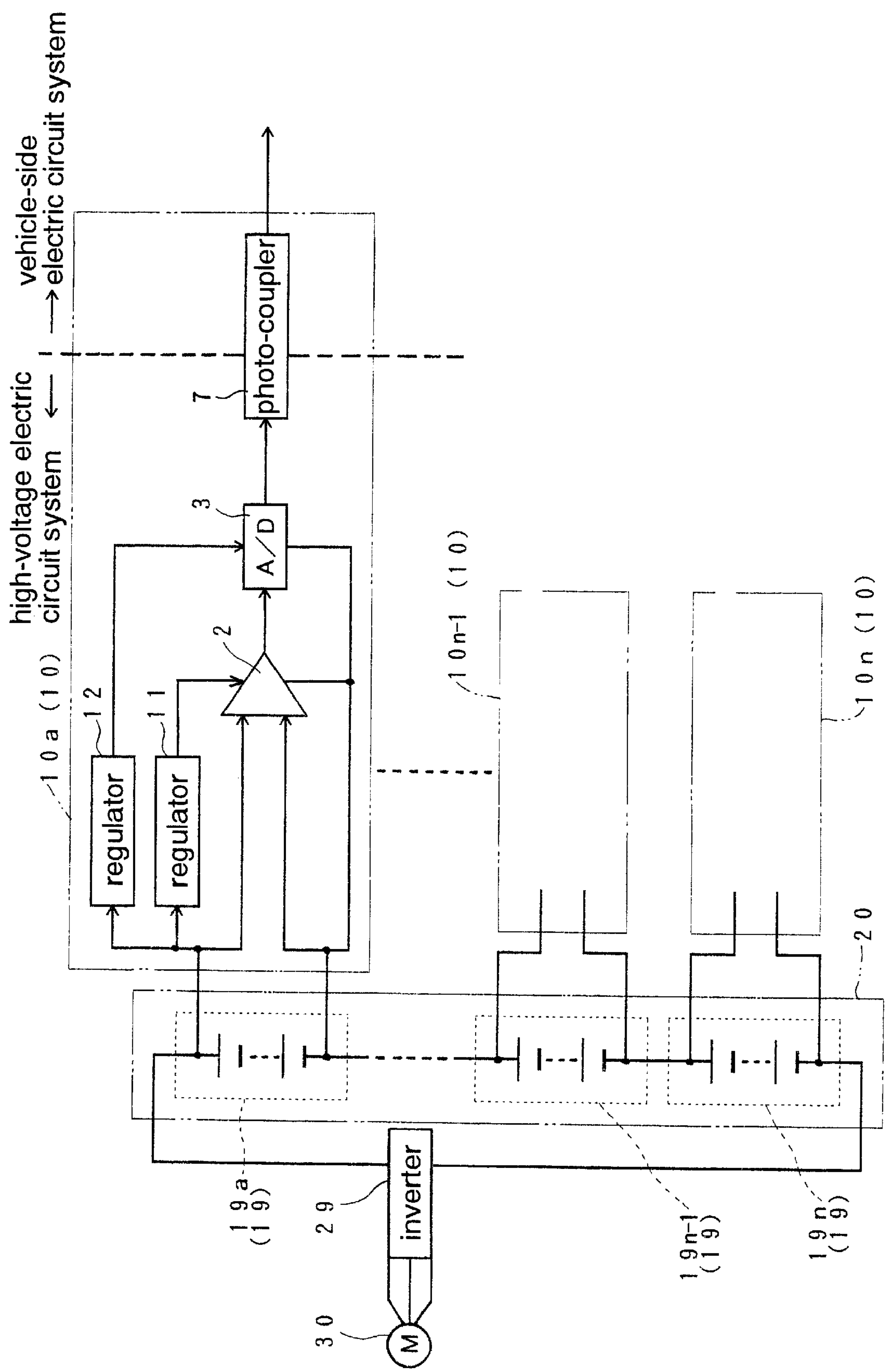
FIG. 2 is a circuit diagram showing the configuration of a battery voltage detecting device according to another embodiment of the present invention.

Preferred embodiments of the present invention will be hereinafter described with reference to the accompanying drawings for an understanding of the invention. It should be noted that the following is only an example of embodiment of the invention, and does not limit the scope of the claims. In the drawings, elements common to the previously described prior art arrangement are given the same reference numerals for distinguishing the elements characteristic of the invention.

The invention is embodied as a battery voltage detecting device for controlling charging and discharging of nickel metal hydride rechargeable batteries constituting a power source device for driving a vehicle which uses an electric motor as well as an internal combustion engine as a drive power source. The battery power source device is composed of a large number of cells which are divided into a plurality of battery modules each including a predetermined number (twelve) of cells, and the voltage detecting device detects the voltage of each battery module.

FIG. 1 illustrates the arrangement of a battery voltage detecting device according to a first embodiment of the invention. The battery power source device 20 is made up of a plurality of battery modules 19*a* to 19*n*, which are respectively provided with voltage detection circuits 1*a* to 1*n*. Each voltage detection circuit 1 includes a differential amplifier 2 (differential detecting means) connected to the end terminals of a battery module 19 through a first photo-relay 5 (open/close means) and a second photo-relay 6 (open/close means), respectively, for detecting the electric potential across the end terminals of the battery module 19. The detected voltage of the battery module is digitized with an A/D converter 3, and transmitted to the controller of the vehicle through an output photo-coupler 7 (output data transmitting means). The first and second photo-relays 5 and 6 are photo-sensitive semiconductor switches, such as photo-MOS-relays™ for example. The first and second photo-relays 5 and 6 are interposed between the battery module 19 and the differential amplifier 2 and closed so as to connect these upon input of open/close control signals from the controller of the vehicle to the voltage detection circuit 1 when detecting the voltage of the battery module 19. The open/close control signals are input through an input photo-coupler 8 (open/close signal transmission means), so that they are input in electrical separation from the low-voltage electric circuit system on the vehicle side, of which ground potential is different from that of the high-voltage electric circuit system of the battery power source device. Thus control is effected to close the photo-relays 5 and 6 upon input of open/close control signals through the input photo-coupler 8 to connect the voltage detection circuit 1 and the battery module 19 only when the voltage of the battery module 19 is to be detected. When not in use, the photo-relays 5 and 6 are opened to disconnect the battery module 19 from the voltage detection circuit 1, thereby preventing wasteful discharge of the batteries due to leak currents.

The battery power source device 20 is composed of a number of serially connected battery modules 19 to output a large drive power necessary for driving the vehicle with a motor 30. Accordingly, the electric circuit system of the battery power source device is a high-voltage electric circuit in comparison to the electric circuit system on the vehicle side for driving the engine. Therefore, the high-voltage electric circuit system of the battery power source device 20 including the voltage detection circuits 1 is floating in relation to the low-voltage electric circuit system on the vehicle side, their ground potentials being electrically insulated from each other. As discussed about with respect to the prior art, the operating power for the voltage detection circuits 1*a* to 1*n* needs to be supplied independently because the potential of battery modules 19*a* to 19*n* connected to these circuits measured from ground is different. Therefore, a power source 15 supplies operating power separately to each of the voltage detection circuits 1*a* to 1*n*. More specifically, the power source 15 transforms the power supplied from the vehicle side through a transformer and supplies power separately to the voltage detection circuits 1*a* to 1*n*.

The voltage detection circuits 1*a* to 1*n* are not only electrically insulated from the vehicle side, but also in electrical separation from each other.

Thus the power source 15 uses the power supplied from the electric circuit system on the vehicle side for supplying operating power to the voltage detection circuits 1 in the high-voltage electric circuit system of the battery power source device 20. Accordingly, there is the possibility that common mode noise mixed into the power source 15 affects the voltage detection circuits 1, leading to erroneous voltage detection. That is, since the power source 15 spans a low-voltage electric circuit system and a high-voltage electric circuit system with different ground potentials with an imbalance in the impedance against ground, it is susceptible to the influence of common mode noise. Since the circuitry includes elements with changing current and voltage such as the inverter 29, and since there are current changes in accordance with charging/discharging of the batteries, there is a great likelihood that common mode noise is generated in the power source 15. In order to eliminate the influence of common mode noise, it is effective to provide each of the voltage detection circuits 1*a* to 1*n* with operating power from their respective battery modules 19. The battery voltage detecting device in accordance with a second embodiment of the invention described below includes an improvement in the arrangement for supplying operating power to the voltage detection circuits.

FIG. 2 illustrates the battery voltage detecting device according to the second embodiment of the invention for a battery power source device 20 composed of a plurality of battery modules 19*a* to 19*n*. The battery modules are respectively provided with voltage detection circuits 10*a* to 10*n*. Each voltage detection circuit 10 includes a differential amplifier 2 for detecting the electric potential across the end terminals of the battery module 19, and the detected voltage is digitized with an A/D converter 3. The voltage relating data thus obtained is then output to the electric circuit system of the controller of the vehicle through a photo-coupler 7. The operating power for each of the voltage detection circuits 10*a* to 10*n* is supplied by each of the battery modules 19*a* to 19*n* respectively connected thereto.

More specifically, the operating power for the differential amplifiers 2 is supplied through a first regulator 11 (first voltage conversion means) connected to each battery module 19 and the operating power for the A/D converters 3 is supplied through a second regulator 12 (second voltage conversion means) connected to each battery module 19. The first and second regulators 11 and 12 are three-terminal regulators, for example, which transform the voltage of the battery modules 19 to a voltage suitable for operating the differential amplifiers 2 or the A/D converters 3.

Thus the operating power for each voltage detection circuit 10*a* to 10*n* is supplied by each corresponding battery module 19, and hence it is not necessary to provide a power source 15 as in the first embodiment described above. In this way, the device is made more compact and light-weighted. Also, the device is made immune to common mode noise which would exist if the power was supplied by a power source 15.

The arrangement in accordance with the second embodiment of the invention described above may be combined with the advantageous features of the arrangement in accordance with the foregoing first embodiment. A third embodiment of the invention described below is one such example and is a battery voltage detecting device with added functionality.

Figure 3:
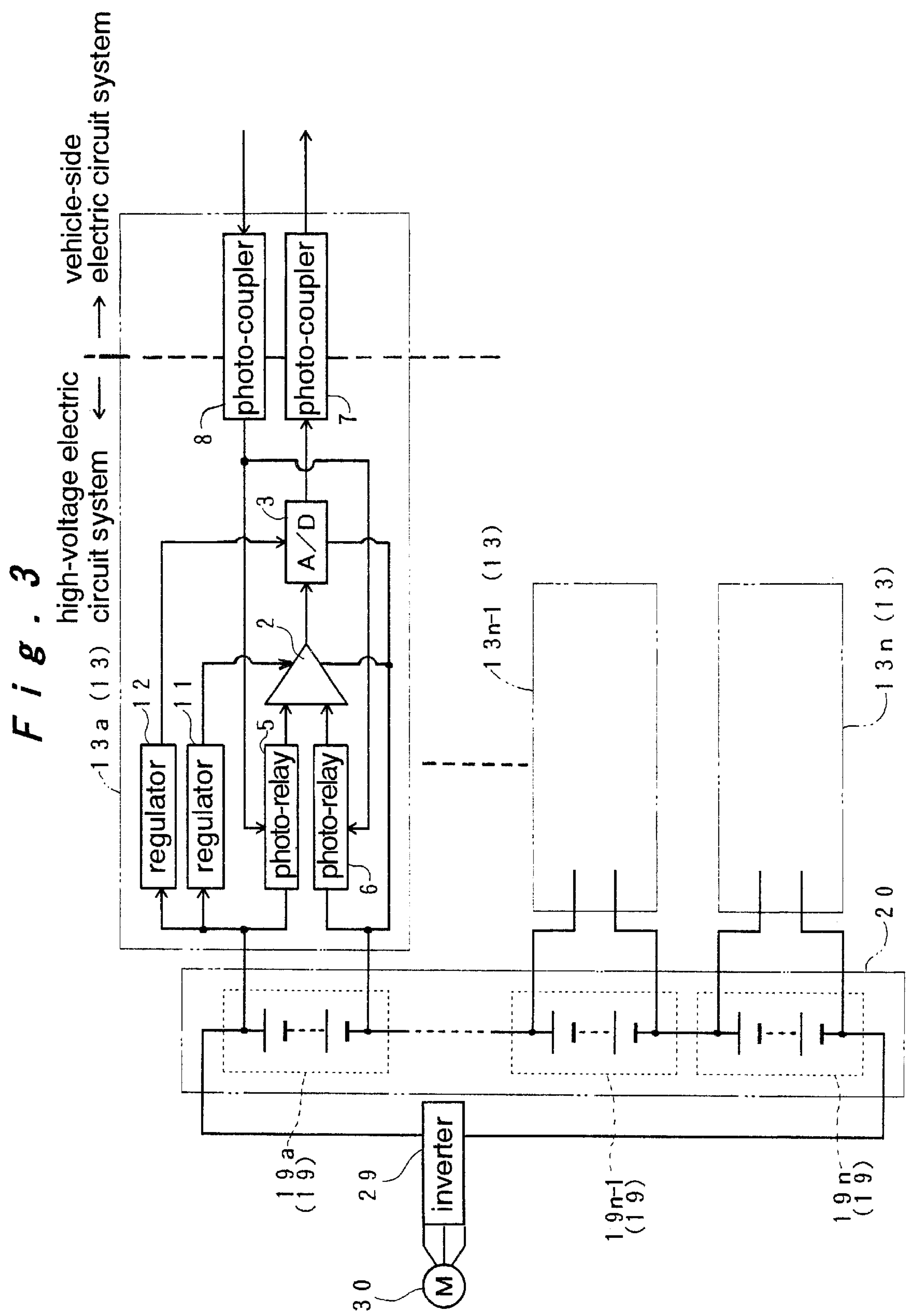
FIG. 3 is a circuit diagram showing the configuration of a battery voltage detecting device according to a further embodiment of the present invention.

Referring to FIG. 3, each voltage detection circuit 13 includes a first photo-relay 5 and a second photo-relay 6 connected to end terminals of the battery module 19, a differential amplifier 2 connected to the first and second photo-relays 5, 6, an A/D converter 3, an output photo-coupler 7, and an input photo-coupler 8. The differential amplifier 2 detects the voltage across both terminals of the battery module 19, and the detected voltage is digitized with the A/D converter 3 and output through the output photo-coupler 7 to the electric circuit system of the controller on the vehicle side. The first and second photo-relays 5, 6 close for connecting the battery module and the differential amplifier 2 in response to an open/close control signal output from the vehicle controller, which is input to the voltage detection circuit 13 for the battery module 19 of which voltage is to be detected. The open/close control signal is input through the input photo-coupler 8, whereupon the input photo-coupler 8 effects control for closing the first and second photo-relays 5, 6. Thus, the voltage detection circuit 13 and the battery module 19 are disconnected from each other except when the voltage of the battery module is detected, thereby preventing wasteful discharge due to leak currents. The operating power for the differential amplifiers 2 is supplied through a first regulator 11 connected to each battery module 19, and the operating power for the A/D converters 3 is supplied through a second regulator 12 connected to each battery module 19. Thus the operating power for each voltage detection circuit 13*a* to 13*n* is supplied by its own battery module 19, and hence it is not necessary to provide a power source 15 as in the first embodiment, and the device is immune to common mode noise.

In the various embodiments of the invention described above, each of the battery modules 19*a* to 19*n* is provided with a corresponding voltage detection circuit 1*a* to 1*n*, 10*a* to 10*n* or 13*a* to 13*n*. A fourth and a fifth embodiments of the invention described below enable a reduction in the number of voltage detection circuits to be made for making the entire device more compact.

Figure 4:
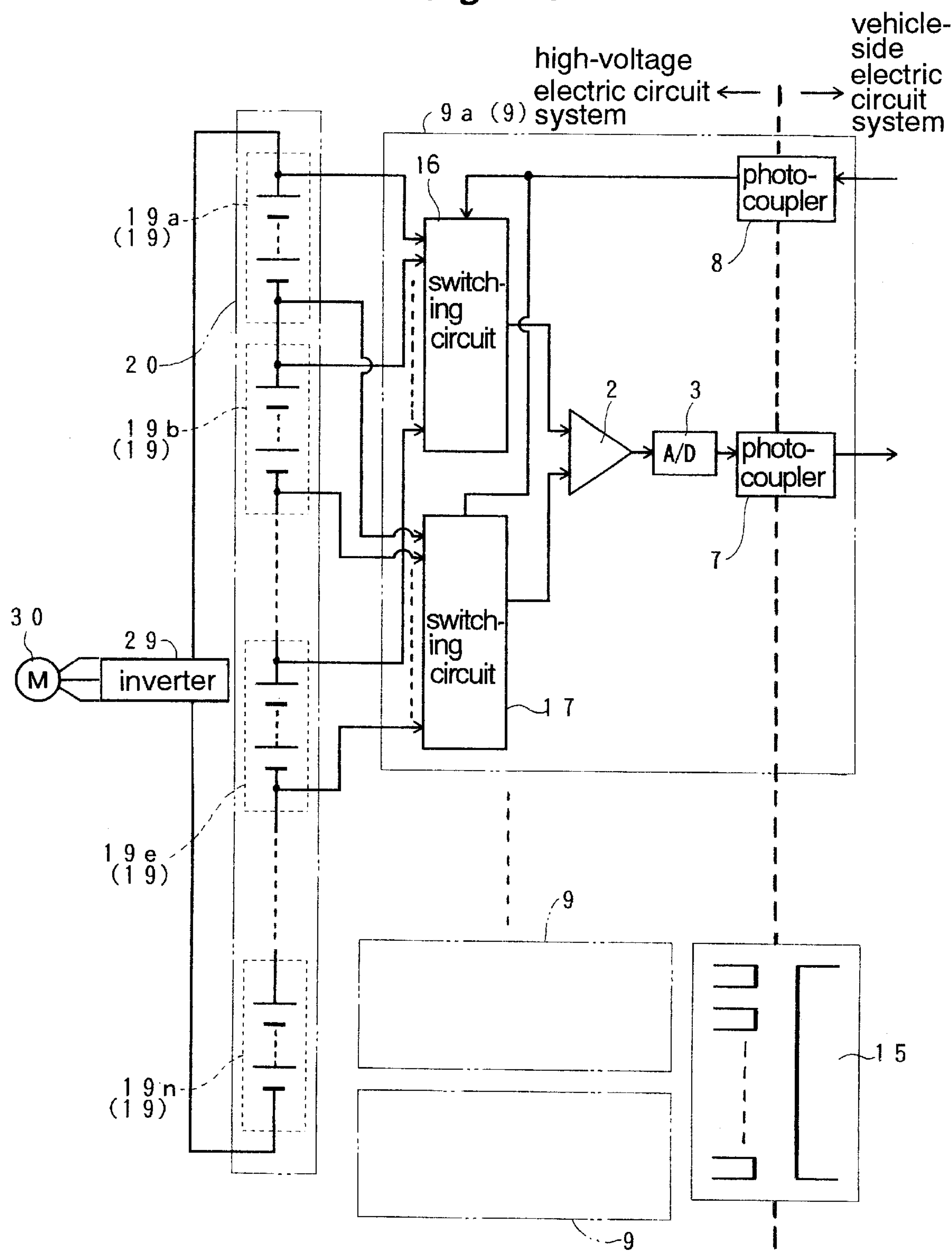
FIG. 4 is a circuit diagram showing the configuration of a battery voltage detecting device according to yet another embodiment of the present invention.
Figure 5:
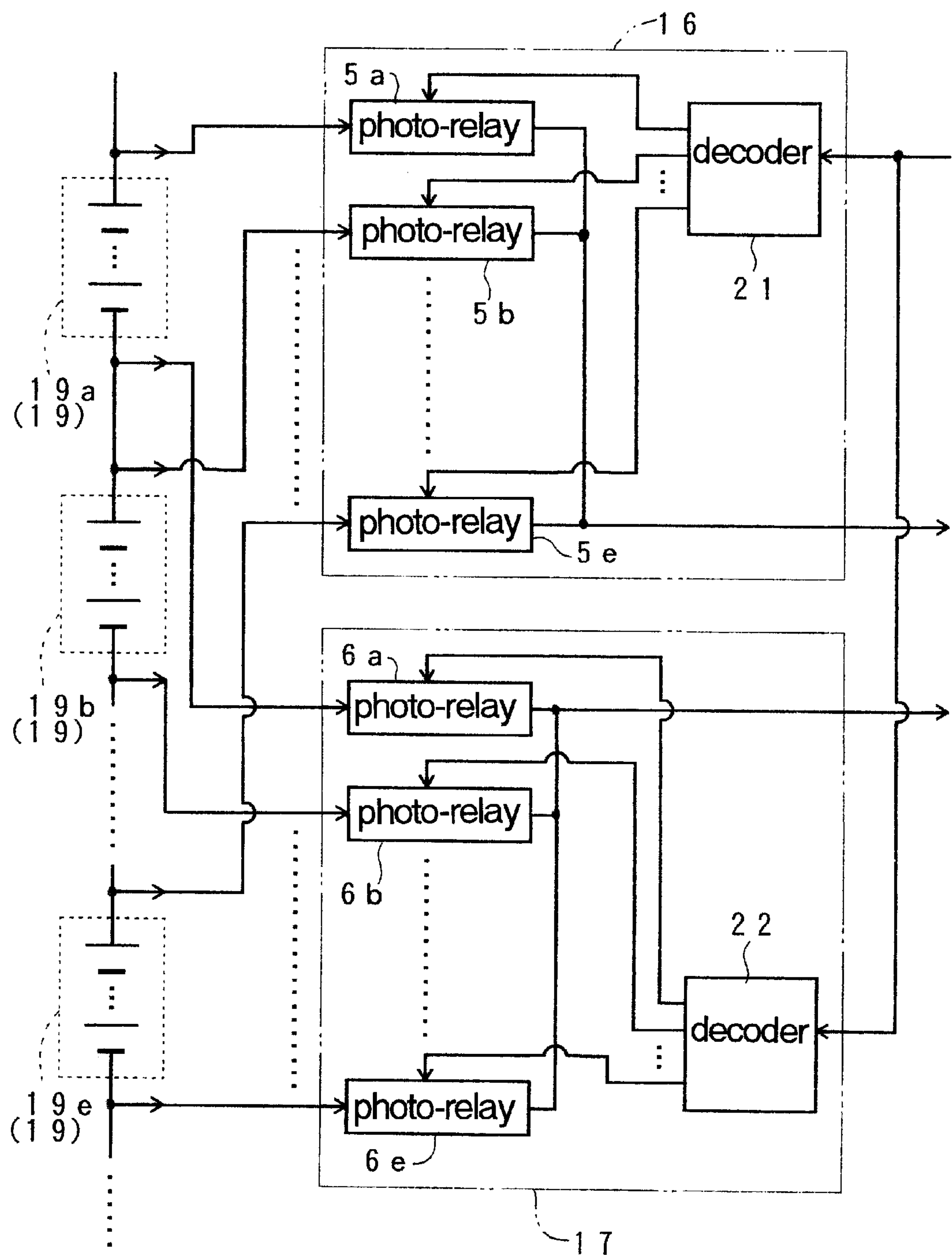
FIG. 5 is a circuit diagram showing the configuration of a switching circuit.

FIG. 4 illustrates a fourth embodiment of the invention, which includes a common voltage detection circuit 9 with respect to a plurality of battery modules 19, so that it detects the voltage of one battery module 19 after the other by switching between the plurality of battery modules 19. As shown in FIG. 4, one voltage detection circuit 9*a* is provided for five battery modules 19*a* to 19*e*. End terminals of each of the battery modules 19*a* to 19*e* are connected to a differential amplifier 2 through switching circuits 16, 17 (detection switching means). FIG. 5 illustrates the switching circuits 16, 17 in more detail. The switching circuit 16 includes a plurality of photo-relays 5*a* to 5*e* corresponding to the positive electrode side of the battery modules 19*a* to 19*e*, while the switching circuit 17 includes a plurality of photo-relays 6*a* to 6*e* corresponding to the negative electrode side of the battery modules 19*a* to 19*e*. The switching circuit 16 further includes a first decoder 21 (open/close control means) for opening and closing the photo-relays 5*a* to 5*e* in accordance with the open/close control signal input from an input photo-coupler 8, whereas the switching circuit 17 further includes a second decoder 22 (open/close control means) for opening and closing the photo-relays 6*a* to 6*e* in accordance with the open/close control signal that is input from the input photo-coupler 8. When, for example, an open/close control signal instructing detection of the voltage of the battery module 19*a* is input, the first and second decoders 21, 22 effect control for closing the photo-relays 5*a*, 6*a* connected to the battery module 19*a*, respectively, so that the end terminals of the battery module 19*a* are connected to the differential amplifier 2 and the voltage of the battery module 19*a* detected. Thus the controller of the vehicle inputs open/close control signals including signals indicative of the identification of each battery module 19 through the input photo-coupler 8, whereby voltage detection data with respect to a selected one of battery modules 19 is output from the output photo-coupler 7. According to this embodiment, the device is much simplified by providing common voltage detection circuits 9 with respect to a plurality of battery modules 1.

The number of battery modules 19 connected to one voltage detection circuit 9, which is set to five in the embodiment described above, is determined by the characteristics of the differential amplifier 2 to be used. That is, when a plurality of battery modules are connected separately to the differential amplifier 2 through the switching circuits 16 and 17, the potential difference to ground that is applied to the input terminal of the differential amplifier 2 differs depending on the position of the battery modules 19. Therefore, the number of battery modules 19 connected to one voltage detection circuit 9 should be set such that the potential difference between various battery modules is within a permissible range for the differential amplifier 2.

Figure 6:
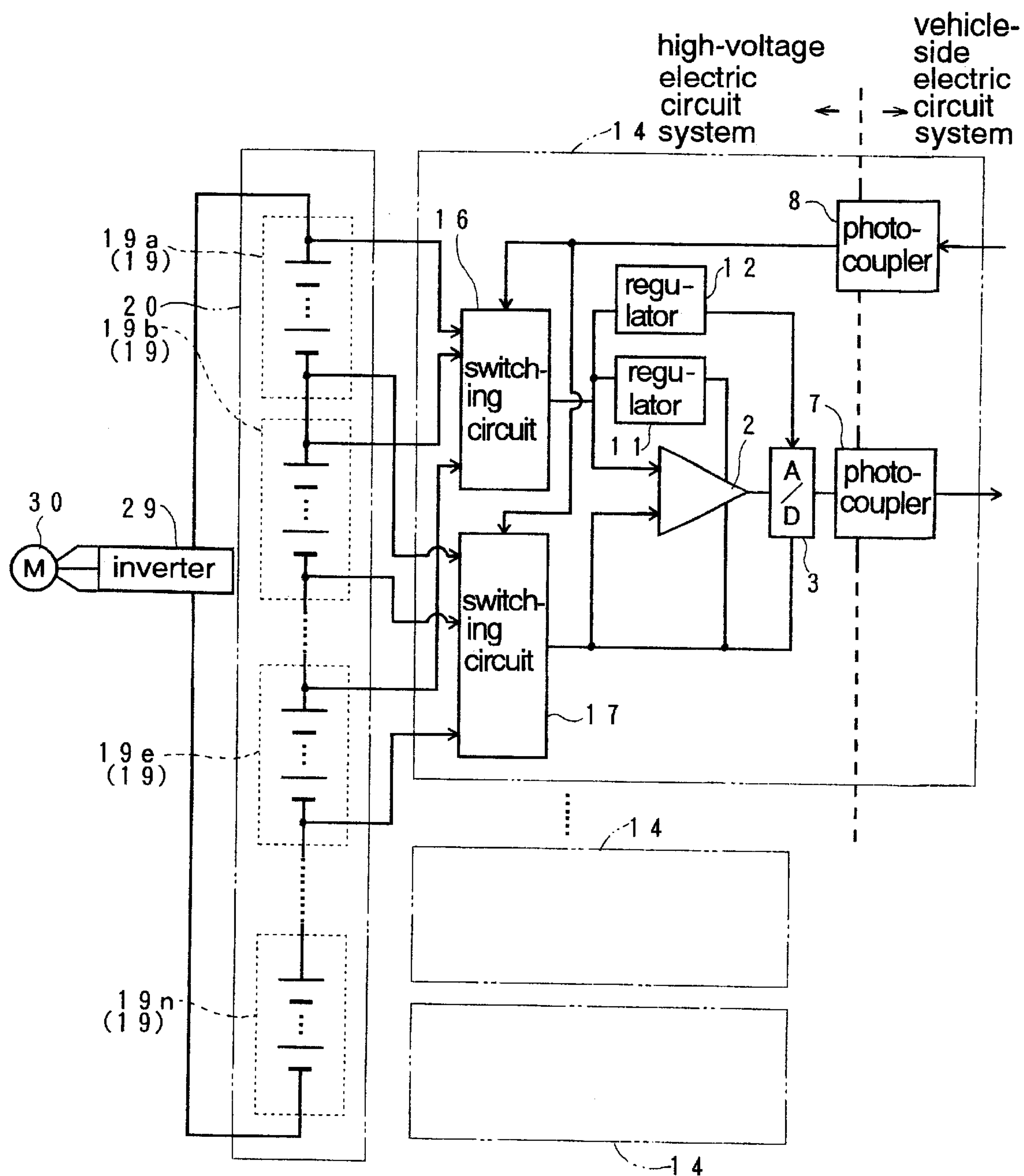
FIG. 6 is a circuit diagram showing the configuration of a battery voltage detecting device according to a further embodiment of the present invention.
Figure 7:
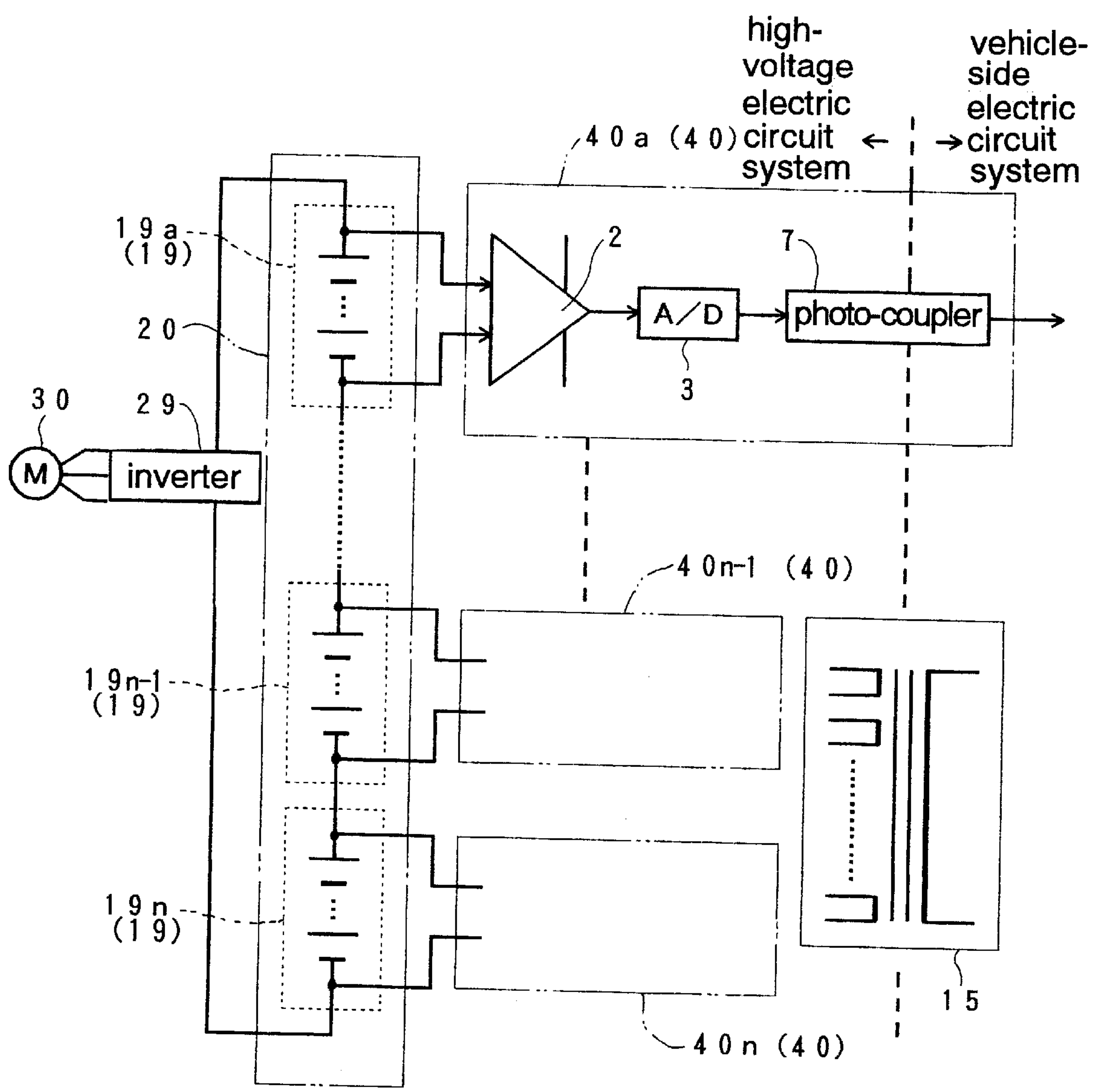
FIG. 7 is a circuit diagram showing the configuration of a conventional battery voltage detecting device.

A fifth embodiment of the invention illustrated in FIG. 6 incorporates the arrangement for providing each voltage detection circuit with operating power obtained from the battery module 19 connected thereto in the arrangement in accordance with the above-described fourth embodiment. The device employs the same switching circuits 16, 17 as those in the fourth embodiment shown in FIG. 5, while the first and second regulators 11, 12 described above with respect to the second embodiment are also provided for supplying operating power to the differential amplifier 2 and to the A/D converter 3.

According to this embodiment, voltage detection circuits 14 are connected to corresponding battery modules 19 by the switching circuits 16, 17 only during the detection of voltage, so that leak currents while the device is not in use are eliminated. The voltage detection circuit 14 obtains its own operating power from the corresponding battery module 19, and hence no additional power source is necessary and the problem of common mode noise attributable to such power source is resolved. Moreover, the voltage detecting device is much simplified by providing common voltage detection circuits 14 with respect to a plurality of battery modules 19.

INDUSTRIAL APPLICABILITY

According to the present invention, as described above, voltage of a large number of cells forming a battery power source device for an electric vehicle is detected for controlling charging and discharging of the battery power source device. voltage detection circuits are connected to respective batteries only during the voltage detection of the batteries, and hence discharge of the batteries due to leak currents is prevented, and consumption of batteries is suppressed. A power source for supplying operating power for the voltage detection circuits may be omitted by providing an arrangement which enables each voltage detection circuit to obtain its operating power from the battery connected thereto, whereby the device becomes immune to noise which induces erroneous voltage detection. Thus the present invention provides a battery voltage detecting device which suppresses power consumption of batteries and enables accurate detection of battery voltage.

What is claimed is:

1. A battery voltage detecting device provided in a battery power source device used as a drive power source of an electric motor for a vehicle, wherein a plurality of rechargeable battery cells are serially connected in a battery pack, the cells being divided into a plurality of groups each including a predetermined number of serially connected cells to form a plurality of battery modules, the battery pack being mounted on the vehicle with its ground potential being electrically insulated from ground potential of an electric circuit system of a controller for the vehicle, the battery voltage detecting device comprising:

- a plurality of voltage detection circuits, respectively provided to the plurality of battery modules, each of the plurality of voltage detection circuits comprising:
  - a differential detecting system that detects a voltage across end terminals of at least one battery module,
  - open/close systems which open and close and that connect and disconnect the differential detecting system to and from the end terminals of the battery module,
  - an A/D converter for digitizing the detected voltage of the battery module output from the differential detecting system,
  - an output data transmission system that transmits data output from the A/D converter to the electric circuit system of the controller for the vehicle electrically insulated therefrom, and
  - an open/close signal transmission system that transmits an open/close signal output from the electric circuit system of the controller for the vehicle to the open/close systems electrically insulated therefrom; and
  - an operating power source electrically insulated from the ground potential of the electric circuit system of the controller for the vehicle for providing each of the voltage detection circuits separately with operating power.

2. A battery voltage detecting device provided in a battery power source device used as a drive power source of an electric motor for a vehicle, wherein a plurality of rechargeable battery cells are serially connected to constitute a battery pack, the cells being divided into a plurality of groups each including a predetermined number of serially connected cells to form a plurality of battery modules, the battery pack being mounted on the vehicle with its ground potential being electrically insulated from ground potential of an electric circuit system of a controller for the vehicle, the battery voltage detecting device comprising:

- a plurality of voltage detection circuits, each provided to a unit of a plurality of battery modules, each of the plurality of voltage detection circuits comprising:
  - a differential detecting system connected through a detection switching circuit to the unit of the plurality of battery modules and that detects a voltage across end terminals of a selected one of the plurality of battery modules,
  - an A/D converted for digitizing the detected voltage of the battery module output from the differential detecting system,
  - an output data transmission system that transmits data output from the A/D converted to the electric system of the controller for the vehicle electrically insulated therefrom,
  - an open/close signal transmission means for transmitting an open/close signal output from the electric circuit system of the controller for the vehicle to the detection switching circuit electrically insulated therefrom, wherein
  - said detection switching circuit comprising:
    - a plurality of open/close systems which open and close that respectively connect and disconnect the differential detecting system to and from the respective end terminals of the plurality of battery modules, and an open/close control system that separately opens and closes a selected one of the plurality of the open/close system in accordance with the open/close control signal input from the open/close signal transmission system, whereby the selected one of open/close systems is closed to connect the differential detecting system to the end terminals of the selected one of the battery modules; and an operating power source electrically insulated from the ground potential of the electric circuit system of the controller for the vehicle for providing each of the voltage detection circuits separately with operating power.

3. A battery voltage detecting device provided in a battery power source device used as a drive power source of an electric motor for a vehicle, wherein a plurality of rechargeable battery cells are serially connected to constitute a battery pack, the cells being divided into a plurality of groups each including a predetermined number of serially connected cells to form a plurality of battery modules, the battery pack being mounted on the vehicle with its ground potential being electrically insulated from ground potential of an electric circuit system of a controller for the vehicle, the battery voltage detecting device comprising:

a plurality of voltage detection circuits, respectively provided to the plurality of battery modules each of the plurality of voltage detection circuits comprising:

a differential detecting system that detects a voltage across end terminals of a battery module, a first voltage conversion system that supplies the differential detecting system with operating power by transforming the voltage of the battery module, an A/D converter for digitizing the detected voltage of the battery module output from the differential detecting system, a second voltage conversion system that supplies the A/D converter with operating power by transforming the voltage of the battery module, and an output data transmission system that transmits data output from the A/D converter to the electric circuit system of the controller for the vehicle electrically insulated therefrom.

4. A battery voltage detecting device provided in a battery power source device used as a drive power source of an electric motor for a vehicle, wherein a plurality of rechargeable battery cells are serially connected to constitute a battery pack, the cells being divided into a plurality of groups each including a predetermined number of serially connected cells to form a plurality of battery modules, the battery pack being mounted on the vehicle with its ground potential being electrically insulated from ground potential of an electric circuit system of a controller for the vehicle, the battery voltage detecting device comprising:

a plurality of voltage detection circuits, respectively provided to the plurality of battery modules, each of the plurality of voltage detection circuits comprising:

a differential detecting system that detects a voltage across end terminals of a battery module, open/close systems which open and close and that connect and disconnect the differential detecting system to and from the end terminals of the battery module, a first voltage conversion system that supplies the differential detecting system with operating power by transforming the voltage of the battery module, an A/D converter for digitizing the detected voltage of the battery module output from the differential detecting system, a second voltage conversion system that supplies the AID converter with operating power by transforming the voltage of the battery module, an output data transmission system that transmits data output from the A/D converter to the electric circuit system of the controller for the vehicle electrically insulated therefrom, and an open/close signal transmission system that transmits an open/close signal, output from the electric circuit system of the controller for the vehicle, to the open/close systems electrically insulated therefrom.

5. A battery voltage detecting device provided in a battery power source device used as a drive power source of an electric motor for a vehicle, wherein a plurality of rechargeable battery cells are serially connected to constitute a battery pack, the cells being divided into a plurality of groups each including a predetermined number of serially connected cells to form a plurality of battery modules, the battery pack being mounted on the vehicle with its ground potential being electrically insulated from ground potential of an electric circuit system of a controller for the vehicle, the battery voltage detecting device comprising:

a plurality of voltage detection circuits, each provided to a unit of a plurality of battery modules, each of the plurality of voltage detection circuits including a differential detecting system connected through a detection switching circuit to the unit of the plurality of battery modules and that detects a voltage across end terminals of a selected one of the plurality of battery modules, a first voltage conversion system that supplies the differential detecting system with operating power by transforming the voltage of the battery module, an A/D converter for digitizing the detected voltage of the battery module output from the differential detecting system;

a second voltage conversion system that supplies the A/D converter with operating power by transforming the voltage of the battery module;

an output data transmission system that transmits data output from the A/D converter to the electric circuit system of the controller for the vehicle electrically insulated therefrom;

an open/close signal transmission system that transmits an open/close signal, output from the electric circuit system of the controller for the vehicle, to the detection switching circuit electrically insulated therefrom, wherein said detection switching circuit comprises:

a plurality of open/close systems which open and close and that respectively connect and disconnect the differential detecting system to and from the respective end terminals of the plurality of battery modules, and an open/close control system that separately opens and closes a selected one of the plurality of open/close systems in accordance with the open/close control signal input from the open/close signal transmission system, whereby the selected one of open/close systems is closed to connect the differential detecting system to the end terminals of the selected one of the battery modules.

* * * * *

UNITED STATES PATENT AND TRADEMARK OFFICE

CERTIFICATE OF CORRECTION

PATENT NO. : 6,462,510 B1
DATED : October 8, 2002
INVENTOR(S) : M. Takada et al.

It is certified that error appears in the above-identified patent and that said Letters Patent is hereby corrected as shown below:

Column 10,
Lines 53 and 57, "converted" should be -- converter --.

Column 11,
Line 6, "system" should be -- systems --.

Column 12,
Line 5, "AID" should be -- A/D --.

Signed and Sealed this

Twenty-fourth Day of June, 2003

JAMES E. ROGAN
*Director of the United States Patent and Trademark Office*